(12) United States Patent
Fujiyoshi et al.

(10) Patent No.: US 8,405,039 B2
(45) Date of Patent: Mar. 26, 2013

(54) DETECTION APPARATUS AND RADIATION DETECTION SYSTEM

(75) Inventors: Kentaro Fujiyoshi, Kumagaya (JP); Chiori Mochizuki, Sagamihara (JP); Minoru Watanabe, Honjo (JP); Takamasa Ishii, Honjo (JP); Jun Kawanabe, Kodama-gun (JP); Hiroshi Wayama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/231,189

(22) Filed: Sep. 13, 2011

(65) Prior Publication Data
US 2012/0080600 A1    Apr. 5, 2012

(30) Foreign Application Priority Data
Sep. 30, 2010   (JP) .................................. 2010-221797

(51) Int. Cl.
*G01T 1/24*    (2006.01)
*G01T 1/20*    (2006.01)
(52) U.S. Cl. .................................. 250/370.14; 250/369
(58) Field of Classification Search .............. 250/370.14
See application file for complete search history.

(56) References Cited

U.S. PATENT DOCUMENTS

| | | | |
|---|---|---|---|
| 6,232,606 B1 * | 5/2001 | Singh | 250/370.09 |
| 6,396,046 B1 * | 5/2002 | Possin et al. | 250/208.1 |
| 7,145,152 B2 * | 12/2006 | Lee et al. | 250/370.14 |
| 2009/0004768 A1 | 1/2009 | Watanabe et al. | |
| 2009/0230443 A1 * | 9/2009 | Mochizuki et al. | 257/292 |
| 2009/0290055 A1 * | 11/2009 | Okada | 348/302 |

FOREIGN PATENT DOCUMENTS

JP    2007-76360 A    3/2007

\* cited by examiner

*Primary Examiner* — Marcus Taningco
(74) *Attorney, Agent, or Firm* — Canon U.S.A., Inc. IP Division

(57) ABSTRACT

A stacked-type detection apparatus includes a plurality of pixels arranged in a matrix having row and column directions. Each pixel includes a conversion element configured to convert radiation or light into an electric charge, and a switch element configured to output an electric signal corresponding to the electric charge. A driving line is connected to switch elements arranged in the row direction, and a signal line is connected to switch elements arranged in the column direction. In each pixel, the conversion element is disposed above the switch element. The signal line is formed by a conductive layer embedded in an insulating layer located below an uppermost surface portion of a main electrode of the switch element located below an uppermost surface portion of the driving line located below the conversion element.

8 Claims, 8 Drawing Sheets

DETECTION APPARATUS AND RADIATION DETECTION SYSTEM

BACKGROUND OF THE INVENTION

1. Field of the Invention

The present invention relates to a detection apparatus applicable to a medical imaging apparatus, a non-destructive testing apparatus, an analysis apparatus using radiation, or the like, and also relates to a radiation detection apparatus and a radiation detection system.

2. Description of the Related Art

In recent years, great advances have been made in technology to produce a liquid crystal display panel using thin film transistors (TFTs), which has allowed it to achieve a large-sized display panel or a large-sized display screen. This technology is also applicable to production of a large-sized area sensor (detection apparatus) having a conversion element such as a photoelectric conversion element realized using semiconductor and a switch element such as a TFT. Such an area sensor may be combined with a fluorescent member to perform a wavelength conversion, i.e., to convert a radiation such as a X-ray into visible light or the like to be used as a radiation detection apparatus such as an X-ray detection apparatus. In general, the pixel structure used in the radiation detection apparatus can be classified into two types, i.e., a single-plane type in which a conversion element and a switch element are disposed in the same plane, and a stacked type in which a conversion element is disposed above (stacked onto) a switch element. In the production of the single-plane type pixels, the conversion element and the switch element can both be produced using the same semiconductor production process. This allows simplification of the production process. In the case of the stacked-type detection apparatus, the provision of the conversion element above the switch element makes it possible to increase the size of the conversion element in each pixel compared with the single-plane type. Therefore, the stacked-type detection apparatus is capable of providing a larger signal, a higher signal-to-noise ratio, and a higher sensitivity than can be provided by the single-plane type detection apparatus. In radiation detection apparatuses, in particular in medical X-ray detection apparatuses, there is a need for a reduction in the amount of radiation a patient is exposed to. To meet this requirement, it is important to achieve a sensor having high sensitivity and high signal-to-noise (S/N) ratio. Next, an explanation is given below as to noise. Noise is generated by many sources. Devices/elements that can be noise sources include conversion elements, switch elements, signal lines, integrating amplifiers, and peripheral circuits. Hereinafter, noise generated by a signal line will be referred to as signal line noise. When a signal line has parasitic capacitance C, the signal line noise is given by a following equation.

$$\text{Signal line noise} = \sqrt{kTC}$$

Hereinafter, noise generated by an integrating amplifier will be referred to as amplifier noise. In a case where an integrating amplifier with feedback capacitance Cf is used as a charge reading amplifier, the amplifier noise is given by the following equation.

$$\text{Amplifier noise} = C/Cf \times \text{noise at amplifier input}$$

Therefore, a reduction in parasitic capacitance C of the signal line is an effective approach to reduce noise of the detection apparatus. That is, to achieve high sensitivity, it is effective to reduce noise by reducing the parasitic capacitance of the signal line.

In the detection apparatus, there is also a need for an increase in driving speed. When a driving line via which a driving pulse is supplied to control turning-on/off of a switch element has capacitance Cg and resistance Rg, the time constant τ of this driving line is given by the following equation.

$$\tau = Cg \times Rg$$

Thus, if the capacitance and/or the resistance of the driving line increases, the time constant τ of the driving line increases. This can cause a driving pulse transmitted via the driving line to become dull or distorted. Therefore, if the turn-on period of the switch element is reduced, the dullness can make it difficult for the switch element to be in an on-state for a designed necessary period. That is, the dullness makes it difficult to reduce the turn-on period, which makes it difficult to increase the driving speed.

Japanese Patent Laid-Open No. 2002-76360 discloses a technique to realize a single-plane type radiation detection apparatus with signal/driving lines (hereinafter, referred to simply as lines) having reduced resistance. U.S. Patent Application No. 2009/0004768 proposes a technique to reduce resistance of an interconnection line in a stacked type radiation detection apparatus.

In detection apparatuses, there is a need for a reduction in pixel pitch, an increase in the number of pixels, an increase in sensitivity, and an increase in driving speed. In particular, medical X-ray detection apparatuses includes a wide variety of types such as an X-ray mammography apparatus, an X-ray transmission detecting apparatus capable of taking a moving image, etc., and a further reduction in pixel pitch and a further increase in the number of pixels are more seriously needed in these various types of medical X-ray apparatuses than in general X-ray detection apparatuses.

In such detection apparatuses, with reducing pixel pitch and increasing number of pixels, the number of interconnection lines and the number of intersects between signal lines and driving lines increase. As a result, capacitance associated with signal lines and driving lines increases. In particular, in a stacked-type detection apparatus such as that disclosed in U.S. Patent Application No. 2009/0004768, an increase also occurs in the number of intersects between signal lines and conversion elements, which causes a further increase in capacitance associated with signal lines. As a result, noise caused by the capacitance associated with the signal lines increases, which results in a reduction in sensitivity. Thus there is a need for a technique to reduce the noise by reducing the capacitance associated with the signal lines. It is also necessary to reduce the time constant associated with driving lines. Furthermore, in the stacked-type detection apparatus, it is necessary to take into account influences of intersects between driving lines and conversion elements as well as influences if intersects between signal lines and driving lines. In sum, in detection apparatuses, in particular in radiation detection apparatuses where the stacked-type pixel structure is employed, it is necessary to increase sensitivity and increase driving speed.

SUMMARY OF THE INVENTION

In view of the above, the present invention provides a technique to achieve a further reduction in noise by a reduction in signal line capacitance and an increase in driving speed by a reduction in time constant associated with a driving line in a detection apparatus, in particular in a stacked-type detection apparatus with a greater number of pixels arranged at smaller intervals.

In an aspect, the present invention provides a detection apparatus including a plurality of pixels arranged in a matrix having row direction and column direction, each pixel including a conversion element configured to convert radiation or light into an electric charge and a switch element configured to output an electric signal corresponding to the electric charge. A driving line is connected to a plurality of switch elements arranged in the row direction, and a signal line is connected to a plurality of switch elements arranged in the column direction. In each pixel, the conversion element is disposed above the switch element. An uppermost surface portion of the driving line is located below the conversion element. An uppermost surface portion of a main electrode of the switch element is located below the uppermost surface portion of the driving line. The signal line includes a conductive layer embedded in an insulating member in a layer lower than the uppermost surface portion of the main electrode of the switch element.

By virtue of the above structure, in the detection apparatus and more particularly in the stacked-type detection apparatus according to one aspect of the present invention, a reduction in noise is achieved by reducing the capacitance associated with the signal line, and an increase in driving speed is achieved by reducing the time constant associated with the driving line.

Further features of the present invention will become apparent from the following description of exemplary embodiments with reference to the attached drawings.

DESCRIPTION OF THE EMBODIMENTS

Figure 1:
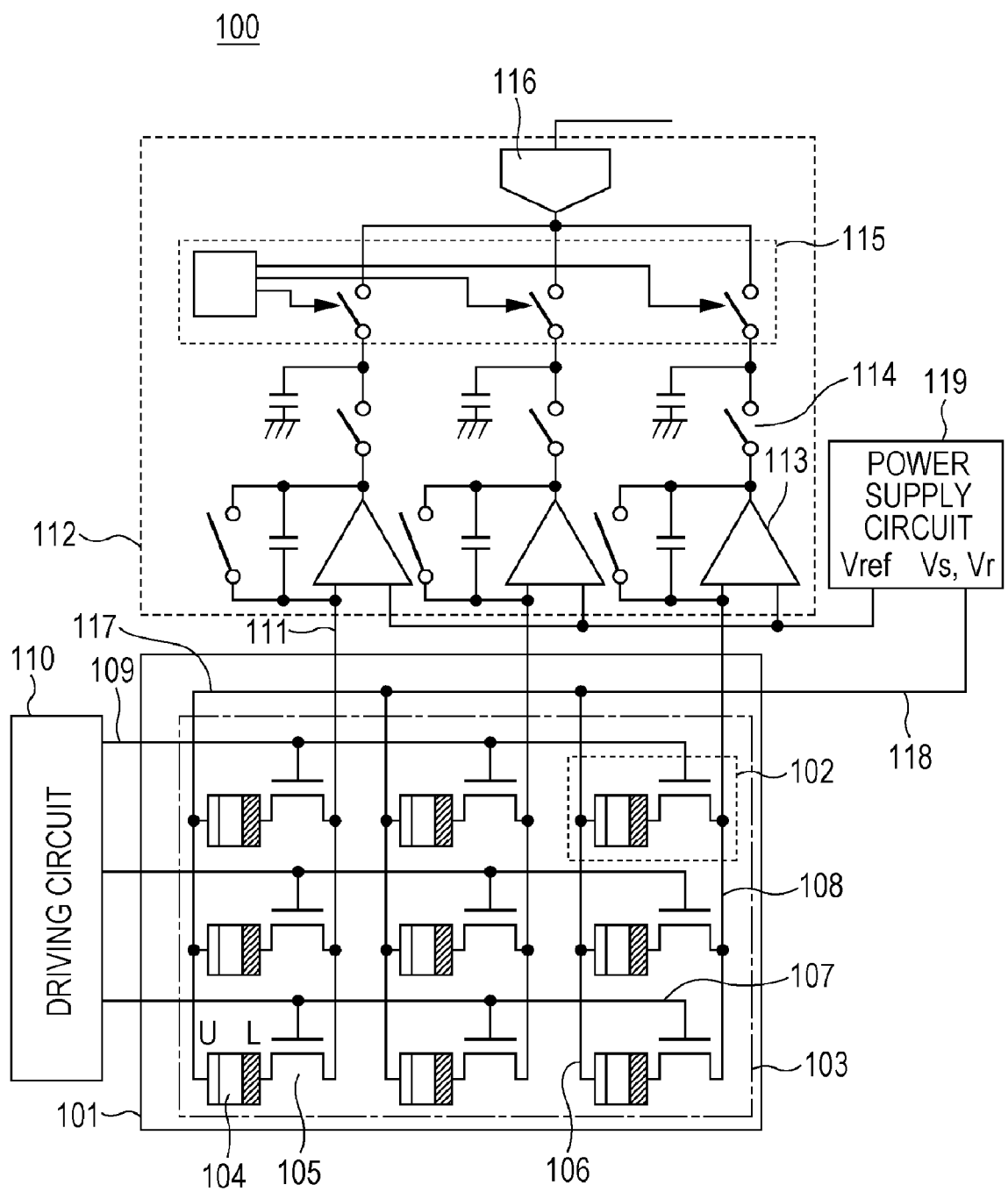
FIG. 1 is an equivalent circuit diagram of a detection apparatus according to a first embodiment of the present invention.

The present invention is described in further detail below with reference to embodiments in conjunction with the accompanying drawings. In the present description, the term "radiation" is used to describe various kinds of radiations including particle beams such as an alpha ray, a beta ray, a gamma ray, etc., radiated via radioactive decay, and other beams with high energy similar to that of such particle beams. For example, a X-ray, a cosmic ray, etc., fall in the scope of radiations. Furthermore, in the present description, the conversion element refers to a semiconductor device configured to convert radiation or light into an electric signal.

First Embodiment

A radiation detection apparatus according to a first embodiment is described below with reference to FIG. 1 and FIGS. 2A to 2D. A radiation detection apparatus 100 according to the first embodiment includes an insulating substrate 101 such as a glass substrate and a pixel region 103 formed on the insulating substrate 101. In the pixel region 103, a plurality of pixels 102 are arranged in a matrix having row and column directions. Each pixel 102 includes a conversion element 104 configured to convert radiation or light into an electric charge, and a switch element 105 configured to output an electric signal corresponding to the electric charge. In the present embodiment, a metal-insulator-semiconductor type (MIS-type) photoelectric conversion element is used as the conversion element, and a thin film transistor (TFT) is used as the switch element. In a case where the conversion element is designed to convert light into an electric charge, a fluorescent member is disposed on (stacked onto) a radiation-incident side of the photoelectric conversion element to convert the radiation into visible light that can be detected by the photoelectric conversion element. A first electrode L of the conversion element 104 is electrically connected to a first main electrode of the switch element 105, and a second electrode U of the conversion element 104 is electrically connected to a bias line 106. Note that the bias line 106 is electrically connected in common to the second electrode U of each of the conversion elements 104 arranged in the column direction. A control electrode of the switch element 105 is electrically connected to a driving line 107, and a second main electrode of the switch element 105 is electrically connected to a signal line 108. Note that the driving line 107 is connected in common to the control electrode of each of the switch elements 105 arranged in a row direction, and also electrically connected to a driving circuit 110 via a first connection line 109. The driving circuit 110 is configured to sequentially or simultaneously supply driving pulses to a plurality of driving lines 107 arranged in the column direction. In this manner, electric signals are output from pixels in units of rows in parallel to a plurality of signal lines 108 arranged in the row direction. Each signal line 108 is electrically connected in common to the second main electrodes of the plurality of switch elements 105 arranged in the column direction. The signal line 108 is also electrically connected to a reading circuit 112 via a second connection line 111. The reading circuit 112 includes integrating amplifiers 113 provided for the respective signal lines 108 and configured to provide an integrated and amplified value of the electric signals received via the signal lines 108, and sample-and-hold circuits 114 configured to sample and hold the amplified electric signals provided by the integrating amplifier 113. The reading circuit 112 further includes a multiplexer 115 configured to convert the electric signals output in parallel from the sample-and-hold circuits into a series electric signal, and an analog-to-digital converter 116 configured to convert the output electric signal into digital data. A reference potential Vref is supplied from a power supply circuit 119 to a non-inverting input terminal of the reading circuit 112. The power supply circuit 119 is also electrically connected to a plurality of bias lines 106 arranged in the row direction via a common bias line 117 and a third connection line 118 to supply a bias potential Vs or an initialization potential Vr to the second electrodes U of the respective conversion elements 104.

Next, an operation of the detection apparatus according to the present embodiment is described below with reference to FIG. 1. The reference potential Vref is applied to the first electrode L of the conversion element 104 via the switch element and the bias potential Vs is applied to the second electrode U thereby biasing the conversion element 104 such that a photoelectric conversion layer of the MIS-type photoelectric conversion element is depleted. In this state, the radiation emitted toward an object under examination passes through the object while attenuating in intensity, and is converted into visible light by a fluorescent member (not shown). The result visible light is incident on the photoelectric conversion element and is converted into an electric charge. The electric signal corresponding to the electric charge is output over the signal line 108 when the switch element 105 turns on in response to the driving pulse applied from the driving circuit 110 to the driving line 107, and the electric signal is read out as digital data by the reading circuit 112. Thereafter, the potential of the bias line 106 is switched from the bias potential Vs to the initialization potential Vr and the switch element 105 is turned on to remove positive or negative residual carriers from the photoelectric conversion element. Thereafter, the potential of the bias line 106 is switched from the initialization potential Vr to the bias potential Vs to complete the initialization of the conversion element 104.

Figure 2A:
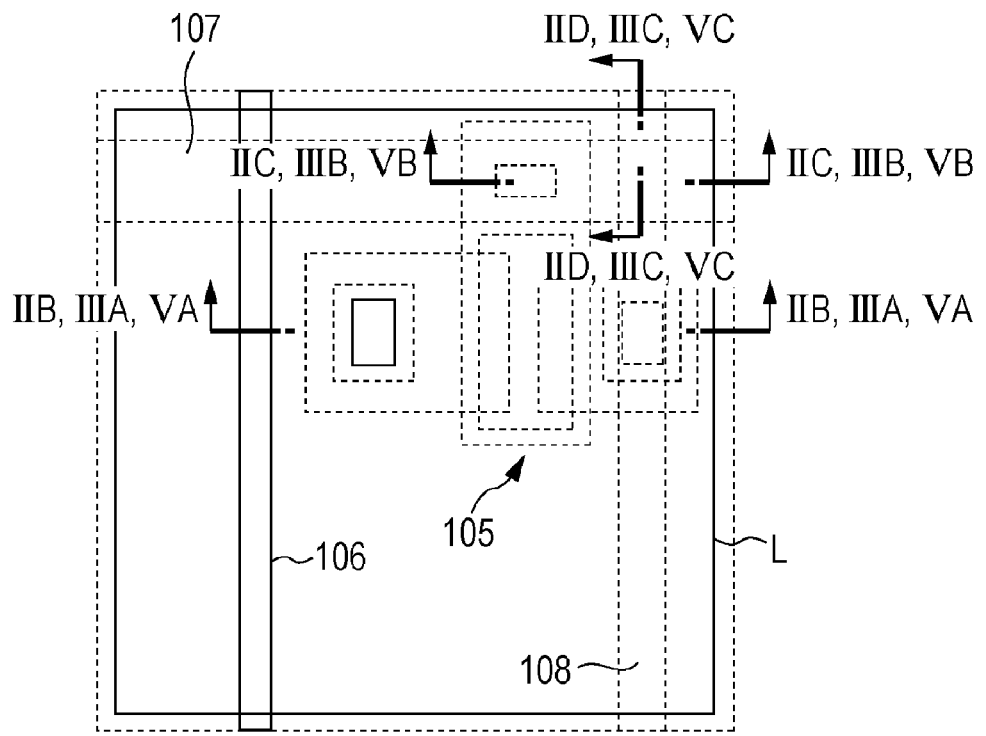
FIG. 2A is a plan view of a pixel of a radiation detection apparatus according to the first embodiment of the present invention.
Figure 2B:
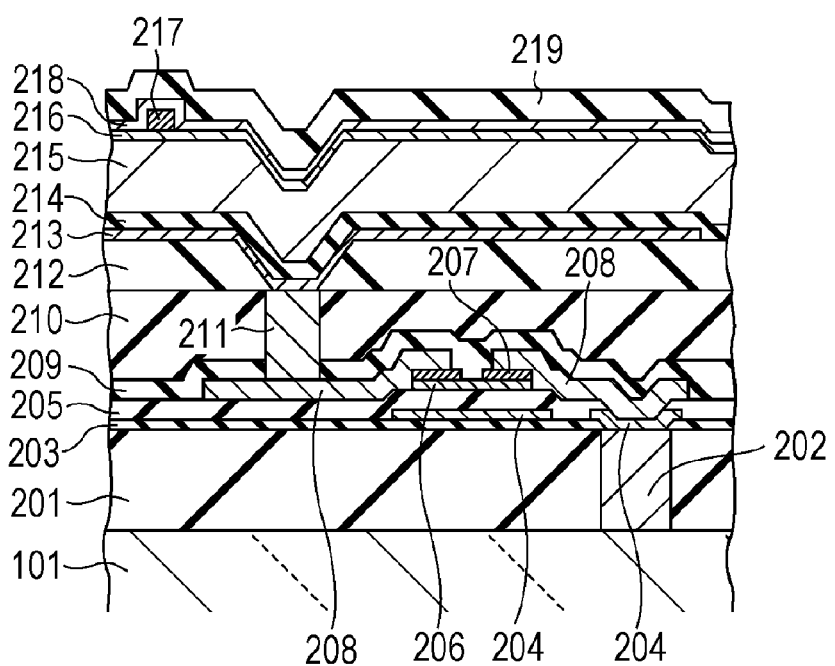
FIGS. 2B to 2D are cross-sectional views thereof.
Figure 2C:
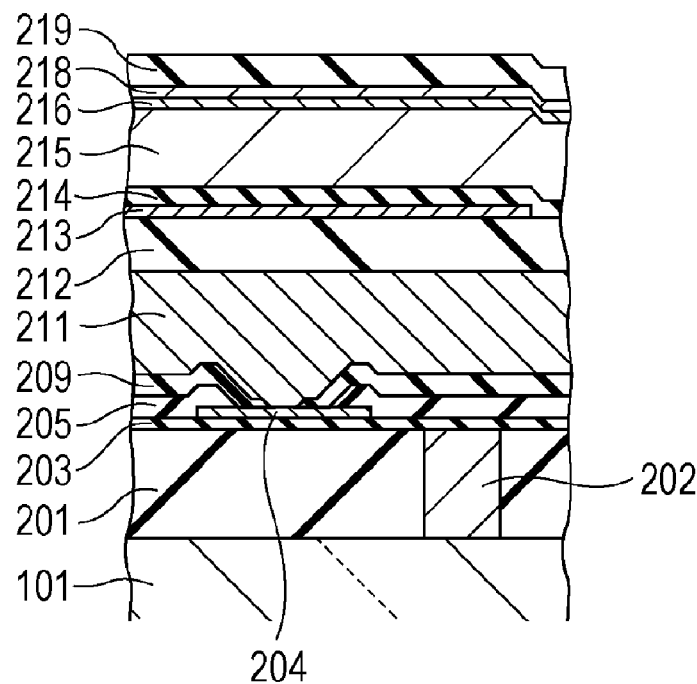
Figure 2D:
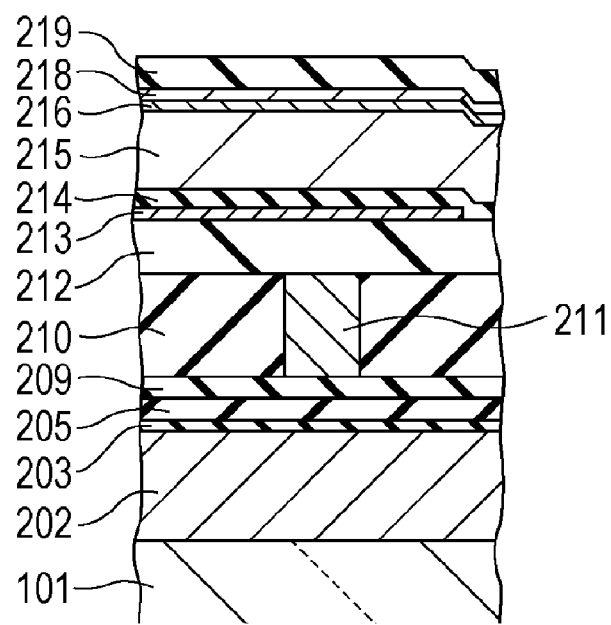

Referring to FIGS. 2A to 2D, a layer structure of one pixel is described below. FIGS. 2B to 2D are cross-sectional views taken along lines IIB-IIB, IIC-IIC, and IID-IID, respectively. As shown in FIG. 2A, one pixel of the radiation detection apparatus according to the present embodiment includes the conversion element 104 serving as a photoelectric conversion element, the switch element 105 realized by a TFT, a part of the signal line 108, a part of the driving line 107, and a part of the bias line 106. In FIG. 2A, for simplicity of illustration, the conversion element 104 is drawn in a simplified manner such that only the first electrode L thereof is shown. As shown in FIGS. 2B to 2D, the TFT serving as the switch element 105 includes elements formed of a plurality of layers stacked on a first insulating layer 201 and a second insulating layer 203, i.e., a second conductive layer 204, a third insulating layer 205, a first semiconductor layer 206, a first impurity semiconductor layer 207, and a third conductive layer 208. The second conductive layer 204 is used as a control electrode (gate electrode) of the TFT, and the third insulating layer 205 is used as a gate insulating film of the TFT. The first semiconductor layer 206 serves as a channel, the first impurity semiconductor layer 207 serves as an ohmic contact layer, and the third conductive layer 208 serves as a first or second main electrode (source or drain electrode) of the TFT. The signal line 108 connected to one main electrode of the TFT serving as the switch element 105 is formed using a first conductive layer 202 embedded in a first insulating layer 201 formed on the insulating substrate 101. More specifically, the first conductive layer 202 is embedded in the first insulating layer 201 such that the uppermost surface portion of the first conductive layer 202 is substantially flush with the uppermost surface portion of the first insulating layer 201. That is, the film thickness of the first insulating layer 201 is substantially equal to the film thickness of the first conductive layer 202. Note that the "uppermost surface portion" refers to a surface area that is located, of any surface area of a conductive layer serving as a line or an insulating layer, closest to the conversion element. As shown in FIG. 2C, the second conductive layer 204 serving as the control electrode of the switch element 105 is connected to the driving line 107 realized by the fourth conductive layer 211 embedded in the fourth insulating layer 209 and the fifth insulating layer 210 located above the switch element 105. More specifically, the fourth conductive layer 211 serving as the driving line 107 is embedded in the fifth insulating layer 210 such that the uppermost surface portion of the fourth conductive layer 211 is substantially flush with the uppermost surface portion of the fifth insulating layer 210. That is, the film thickness of the fifth insulating layer 210 is substantially equal to the film thickness of the fourth conductive layer 211. The three insulating layers, i.e., the second insulating layer 203, the third insulating layer 205, and the fourth insulating layer 209 are located between the first conductive layer 202 serving as the signal line 108 and the fourth conductive layer 211 serving as the driving line 107 to achieve reduced capacitance between the signal line 108 and the driving line 107.

A MIS-type photoelectric conversion element serving as the conversion element 104 is formed on a sixth insulating layer 212 disposed above the driving line 107. The MIS-type photoelectric conversion element includes a fifth conductive layer 213, a seventh insulating layer 214, a second semiconductor layer 215, a second impurity semiconductor layer 216, and a seventh conductive layer 218. The fifth conductive layer 213 serves as a lower electrode (first electrode L) of the photoelectric conversion element. The seventh insulating layer 214 serves as a perfect insulating layer for blocking generated positive and negative carriers from moving. The second semiconductor layer 215 serves as a photoelectric conversion layer that converts a radiation or light into an electric charge. The second impurity semiconductor layer 216 serves as a blocking layer that blocks positive or negative carriers from moving. The seventh conductive layer 218 serves as an upper electrode (second electrode U). The sixth conductive layer 217 serves as the bias line 106. The upper electrode (second electrode U) realized using the seventh conductive layer 218 serves to apply a bias voltage to the whole conversion element 104, wherein the bias voltage is equal to the difference between the bias potential Vs or the initialization potential Vr supplied via the bias line 106 and a reference potential Vref supplied to the first electrode L. The fifth conductive layer 213 serving as the first electrode L of the conversion element is connected to the other main electrode of the TFT serving as the switch element 105 via the fourth conductive layer 211 serving as a connection plug.

As described above, in the detection apparatus according to the present embodiment, the signal line 108, the switch element 105, the driving line 107, the conversion element 104, and the bias line 106 are disposed one on another on the insulating substrate 101. Above those, the eighth insulating layer 219, a protection layer (not shown), and a fluorescent member (not shown) are further disposed. One pixel is formed by these elements described above. That is, the radiation detection apparatus according to the present embodiment is of a stacked type in which the conversion element is located above the switch element.

In the present embodiment, as described above, the first main electrode and the second main electrode of the TFT serving as the switch element 105 are formed in a layer different from a layer in which the signal line 108 is formed. The first conductive layer 202 serving as the signal line 108 is provided in a form such that it is embedded in the first insulating layer 201. This allows the first conductive layer 202 serving as the signal line 108 to be formed with a large thickness. Thus, in the radiation detection apparatus, to reduce the pixel pitch and increase the number of pixels, the line width can be reduced without causing a significant increase in the resistance of the signal line 108. The signal line 108 has capacitance at a part at which the signal line 108 intersects the driving line 107 and also at a part at which the signal line 108 intersects the first electrode L of the conversion element 104. In the present embodiment, the small width of the signal line 108 results in a reduction in the overlapping area at each intersection, which leads to a reduction in capacitance at the intersection. The overlapping area between the signal line 108 and the first electrode L of the conversion element 104 is greater than the overlapping area between the signal line 108 and the driving line 107. In view of the above, the signal line 108 is formed by the first conductive layer 202 such that the first conductive layer 202 is embedded in the first insulating layer 201 that is an insulating member formed in a layer lower than the uppermost surface portion of the main electrode of the switch element 105 located lower than the uppermost surface portion of the conductive layer serving as the driving line 107 located below the conversion element 104 and such that the uppermost surface portion of the signal line 108 is located apart from the conversion element by a greater distance than the distance between the uppermost surface portion of the driving line 107 and the conversion element thereby achieving a reduction in the capacitance at the intersection between the signal line 108 and the conversion element. Furthermore, between the signal line 108 and the driving line 107, there are disposed at least the insulating layer forming the switch element 105 and an insulating layer for protecting the switch element 105. This results in a further reduction in the capacitance at the intersection between the signal line 108 and the driving line 107. Furthermore, in the present embodiment, the fourth conductive layer 211 is embedded in the fifth insulating layer 210. This allows it to obtain a large thickness for the third insulating layer 210 located between the signal line 108 and the first electrode L of the conversion element 104. As for the sixth insulating layer 212, it is possible to achieve a large thickness by properly selecting a material thereof. The large thickness of the sixth insulating layer 212 allows a reduction in capacitance between the signal line 108 and the first electrode L of the conversion element 104 at an intersection between them. The line capacitance of the signal line 108 is given by the total capacitance of the capacitance of the signal line 108 and the capacitance of the one of the main electrodes of the switch element 105 connected to the signal line 108. In the high-speed radiation detection apparatus, if amorphous silicon TFT is used as the switch element 105, then the result is an increase in the size of the switch element 105. In this case, the total capacitance of the signal line 108 can be reduced by reducing the distance between the main electrode of the switch element 105 and the first electrode L of the conversion element 104. Therefore, it is possible to reduce the pixel pitch and/or increase the number of pixels and the number of intersections between the signal line 108 and the driving line 107 or the conversion element 104 while maintaining low resistance and low capacitance for the signal line 108, which allows it to prevent an increase in noise due to the signal line capacitance. Furthermore, because it is allowed to reduce the line width of the signal line 108, it is possible to reduce the capacitance of the driving line 107 at the intersection between the signal line 108 and the driving line 107.

The control electrode of the TFT serving as the switch element 105 is realized by a conductive layer different from a conductive layer by which the driving line 107 is realized. Furthermore, because the fourth conductive layer 211 serving as the driving line 107 is embedded in the fifth insulating layer 210, it is possible to achieve an increased thickness for the fourth conductive layer 211 serving as the driving line 107, which makes it possible to reduce the resistance of the driving line 107 even in a case where a limitation on a layout does not allow an increase in the line width of the driving line 107. Furthermore, increasing in the thickness of the driving line 107 makes it possible to reduce the width of the driving line 107 without causing an increase in resistance. Thus it is possible to reduce the intersection area between the driving line 107 and the signal line 106 by reducing the width of the driving line 107. Thus, of the capacitance of the driving line 107, capacitance caused by the overlapping with the signal line can be reduced. Furthermore, it is possible to reduce the area of the intersection between the driving line 107 and the first electrode L by reducing the width of the driving line 107 although the distance between the driving line 107 and the first electrode L of the conversion element is also reduced. This makes it possible to prevent a significant increase in capacitance at the intersection between the driving line 107 and the first electrode L. Therefore, it is possible to reduce the pixel pitch and/or increase the number of pixels and the number of intersections between the driving line 107 and the signal line 108 or the conversion element 104 while maintaining low resistance and low capacitance for the driving line 107, which allows it to prevent an increase in time constant of the driving line.

Figure 3A:
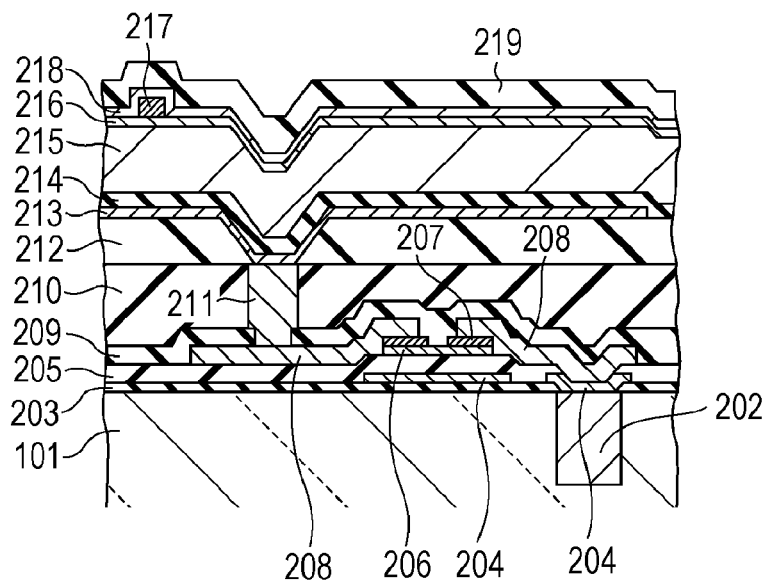
FIGS. 3A to 3C are cross-sectional views illustrating another example of a structure of a pixel of the radiation detection apparatus according to the first embodiment of the present invention.
Figure 3B:
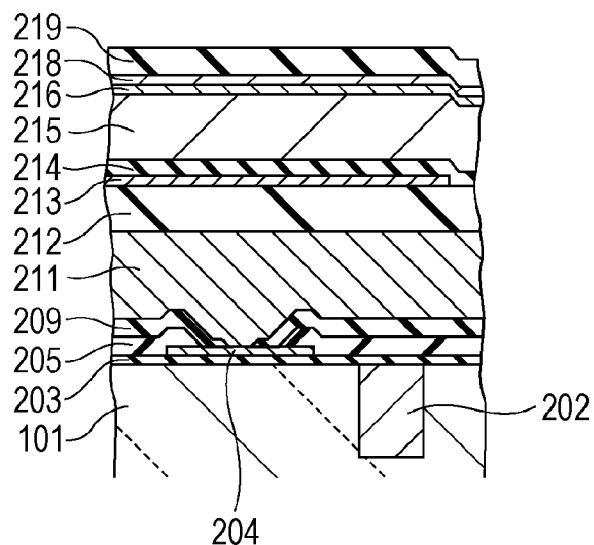
Figure 3C:
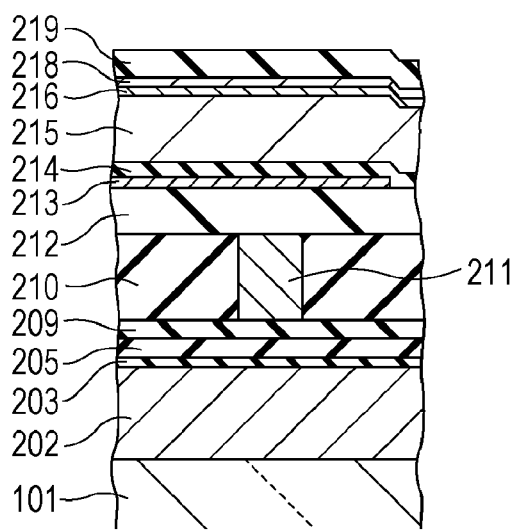

In the example described above, the first conductive layer 202 serving as the signal line 108 is embedded in the first insulating layer 201 formed on the insulating substrate 101, but the present invention is not limited to this configuration. For example, the first insulating layer 201 may be formed in a multilayer structure including a plurality of insulating layers, and the first conductive layer 202 may be formed in the multilayer structure. Another example of a structure according to the present embodiment is described below with reference to FIGS. 3A to 3C. FIGS. 3A to 3C are cross-sectional views taken along lines IIIA-IIIA, IIIB-IIIB, and IIIC-IIIC, respectively. In this example, there is no first insulating layer 201 on the insulating substrate 101 but the first conductive layer 202 is embedded in the insulating substrate 101. That is, in the present example, the insulating substrate 101 serves as the insulating member located lower than the uppermost surface portion of the switch element 105 and the uppermost surface portion of the conductive layer serving as the driving line 107 located below the conversion element 104. In this configuration, unlike the configuration shown in FIGS. 2A to 2D, it is not necessary to provide the first insulating layer 201. Furthermore, in the present embodiment, the second insulating layer 203 is not necessarily needed, but the second insulating layer 203 may be provided as required.

To reduce the resistance of interconnection lines, a thick insulating member may be used and grooves may be formed therein. To meet the above requirement, an organic insulating film that is easy to form or an inorganic insulating film with a low stress may be used as a material of the first insulating layer 201 or the fifth insulating layer 210. The grooves may be formed by photolithography. In a case where an inorganic insulating film is used, a photolithography process may be first performed and then an etching process may be performed. More specifically, when a silicon oxide film or a silicon nitride film is used as the inorganic insulating film, the groove can be formed easily using hydrofluoric acid or the like as an etchant. On the other hand, in a case where an organic insulating film is used, the organic insulating film may be formed so as to include a photosensitive agent, and the organic insulating film may be subjected to a developing process to form the grooves. In the developing process or the hydrofluoric acid process, if the process proceeds isotropically, it is difficult to obtain interconnection lines with a high aspect ratio. Therefore, when grooves are formed in the organic insulating film by the developing process, a high-resolution exposure apparatus may be used in the lithography process to obtain grooves having a high aspect ratio, i.e., having a relatively large film thick thickness compared with its line width. On the other hand, grooves are formed in the inorganic insulating film, it is possible to achieve grooves with a high aspect ratio by anisotropic dry etching using ECR, ICP, etc. The capacitance between an interconnection line embedded in the organic insulating film or the inorganic insulating film and other interconnection lines or electrodes can be reduced by selecting a material thereof with a low dielectric constant. Low resistance can be achieved by selecting a material with a low specific resistance for the interconnection lines, such as copper, aluminum, silver, gold, platinum, or the like or a compound thereof. A damascene process or the like may be used to form the interconnection lines. More specifically, for example, a film is first formed over a whole surface area using a sputtering process, an evaporation process, or the like, and then planarization is performed by CMP (Chemical Mechanical Polishing) or the like. Alternatively, a film of an interconnection line material may be formed in a particular area using plating or the like and then planarization may be performed. In any case, the signal line 108 is formed so as to have a film thickness equal to the film thickness of the first insulating layer 201. If a refractory material is selected for the signal line 108, and the signal line 108 is embedded in a refractory inorganic insulating film such as a glass film, then it is possible to employ a high-temperature process performed at, for example, 350° C. or higher to form a semiconductor layer in an upper layer in forming the TFT, which allows the resultant TFT to have low resistance.

Although only 3×3 pixels are shown in FIG. 1, a practical radiation detection apparatus may include as many pixels as, for example, 2000×2000 pixels. In the present embodiment, the radiation detection apparatus is of the indirect type in which the photoelectric conversion element and the fluorescent member are combined, the present invention is not limited to this type. Similar advantages to those obtained in the embodiment described above can also be obtained for a radiation detection apparatus of a direct type in which the photoelectric conversion element is replaced with a conversion element including a semiconductor layer such as amorphous selenium disposed between electrodes and capable of directly converting a X-ray, a gamma ray or a particle beam such as an alpha ray or beta ray into an electric charge. Furthermore, the conversion element used in the radiation detection apparatus of the indirect type is not limited to the MIS-type photoelectric conversion element, but other types of photoelectric conversion elements such as a PIN-type photodiode may be used. In the present embodiment, an inverted stagger structure is employed for the TFTs used as the switch element. However, the TFT structure is not limited to the inverted stagger structure. For example, a stagger structure may be employed.

Second Embodiment

Figure 4A:
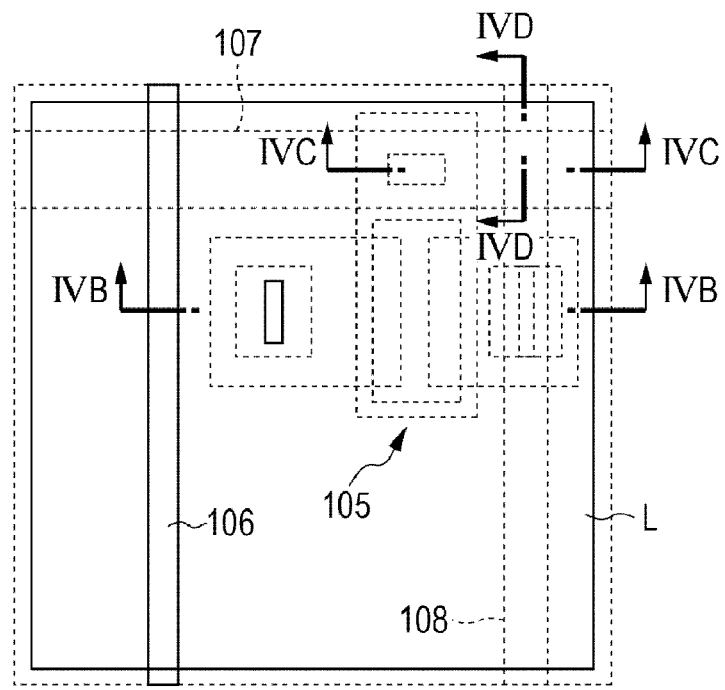
FIG. 4A is a plan view of a pixel of a detection apparatus according to a second embodiment of the present invention.
Figure 4B:
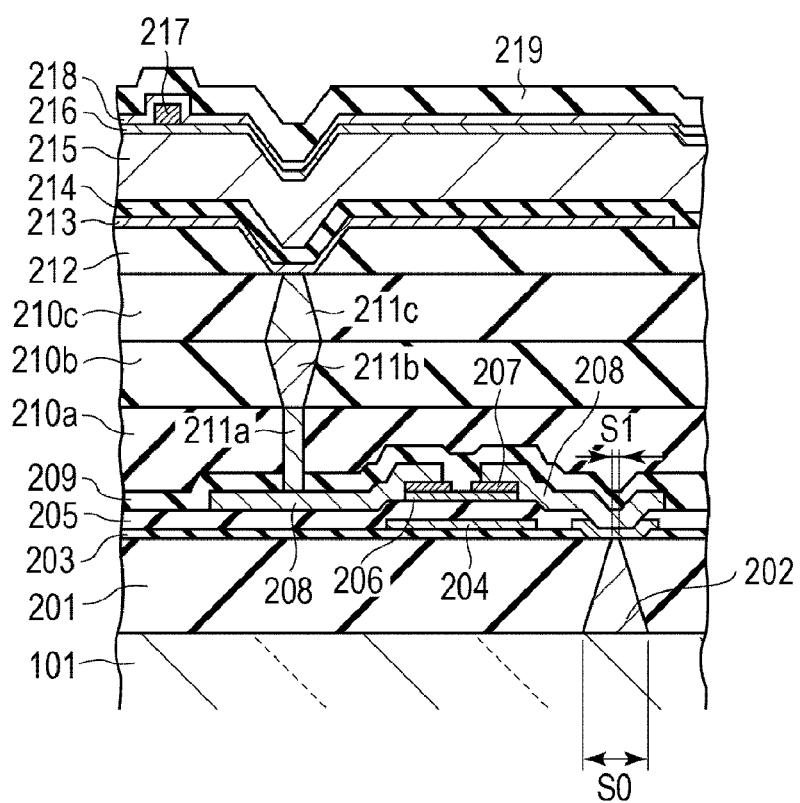
FIGS. 4B and 4C are cross-sectional views thereof.
Figure 4C:
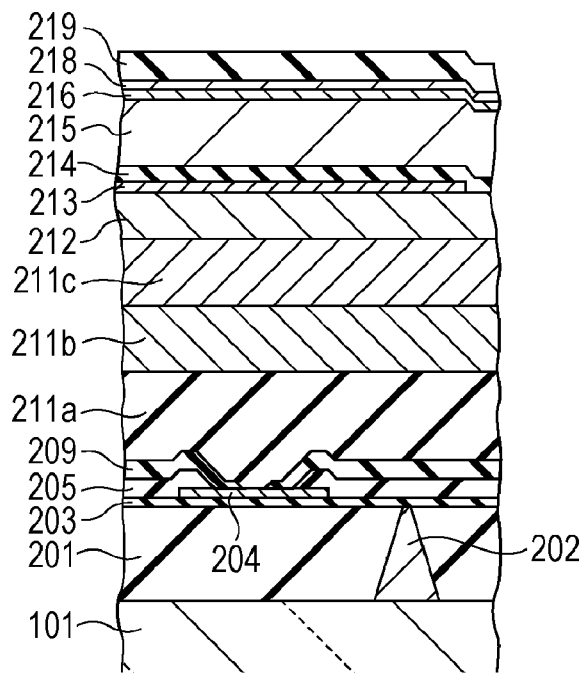
Figure 4D:
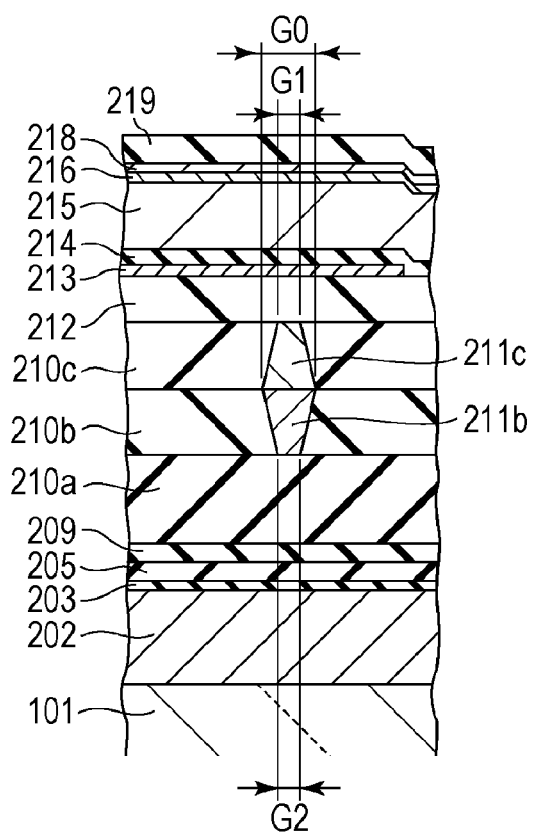

A second embodiment of the present invention is described below with reference to FIGS. 4A to 4D. FIG. 4A is a plan view of a pixel of a radiation detection apparatus according to the second embodiment of the present invention, and FIGS. 4B to 4D are cross-sectional views taken along lines IVB-IVB, IVC-IVC, and IVD-IVD, respectively, in FIG. 4A. The equivalent circuit and the operation principle of the radiation detection apparatus are similar to those according to the first embodiment, and thus a further description thereof is omitted.

The present embodiment is different from the first embodiment in that shapes of the signal line 108 and the driving line 107 are controlled. Line capacitance of the signal line 108 occurs at an intersection between the signal line 108 and the driving line 107 and at an intersection between the signal line 108 and the first electrode L of the conversion element 104. In each case, capacitance occurs between the signal line 108 and a conductive layer located above the signal line 108. In view of the above, in the present embodiment, the first insulating layer 201 is formed using an organic insulating film having negative photosensitivity, and the first conductive layer 202 serving as the signal line is embedded in the first insulating layer 201 such that the upper width S1 of the first conductive layer 202 serving as the signal line 108 is smaller than the maximum width S0 of the first conductive layer 202 as shown in FIG. 4B thereby reducing the capacitance between the signal line 108 and the upper conductive layers.

The fifth insulating layer 210 is formed using three different kinds of insulating materials into a multilayer structure including a fifth insulating layer 210a, a fifth insulating layer 210b, and a fifth insulating layer 210c, and the fourth conductive layer 211 is realized by 211a to 211c. More specifically, the sixth insulating layer 210b is realized using an organic insulating film having positive photosensitivity, while the fifth insulating layer 210c is realized using an organic insulating film having negative photosensitivity. Furthermore, the fourth conductive layers 211b and 211c are embedded in the fifth insulating layers 210b and 210c, respectively, thereby forming the driving line 107 as shown in FIG. 4D such that the upper width G1 of the fourth conductive layer 211c serving as the driving line 107 is smaller than the maximum width G0 of the driving line 107 wherein the maximum width G0 is given by the lower width of the fourth conductive layer 211c or the upper width of the fourth conductive layer 211b and such that the lower width G2 of the fourth conductive layer 211b forming the driving line 107 is smaller than the maximum width G0 of the driving line 107 wherein as described above the maximum width G0 is given by the lower width of the fourth conductive layer 211c or the upper width of the fourth conductive layer 211b thereby achieving a reduction in the area of the intersection between the first conductive layer 202 serving as the signal line 108 and the fourth conductive layer 211b serving as the driving line 107 and achieving a reduction in the area of the intersection between the fourth conductive layer 211c serving as the driving line 107 and the fifth conductive layer 213 serving as the first electrode L of the conversion element 104. Thus, the present embodiment makes it possible to further reduce the signal line capacitance and the driving line capacitance compared with the first embodiment. Therefore, the present embodiment makes it possible to achieve a stacked-type now-noise radiation detection apparatus capable of being driven at a high speed. As shown in FIG. 4B, the fourth conductive layers 211a to 211c are also used to form a connection plug that connects the fifth conductive layer 213 serving as the first electrode L of the conversion element to the other one of the main electrodes of the TFT serving as the switch element 105.

Third Embodiment

Figure 5A:
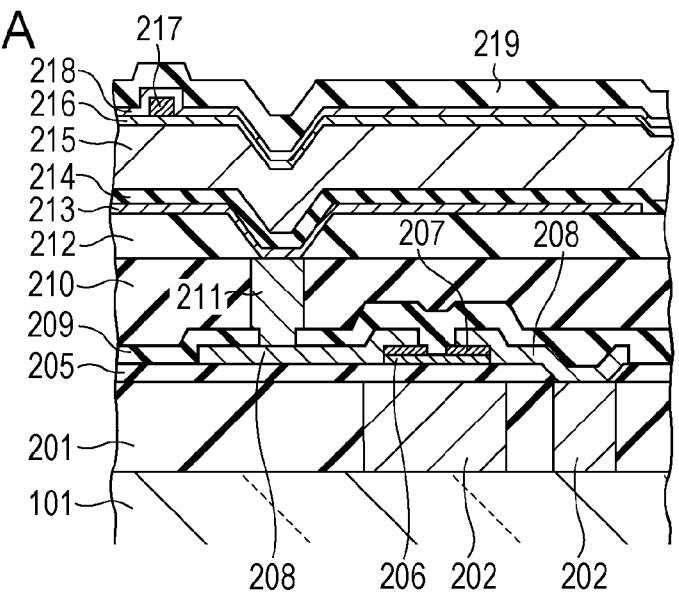
FIGS. 5A to 5C are cross-sectional views illustrating a structure of a pixel of a radiation detection apparatus according to a third embodiment of the present invention.
Figure 5B:
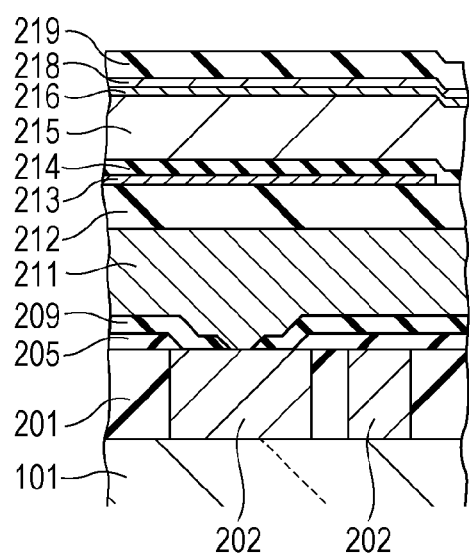
Figure 5C:
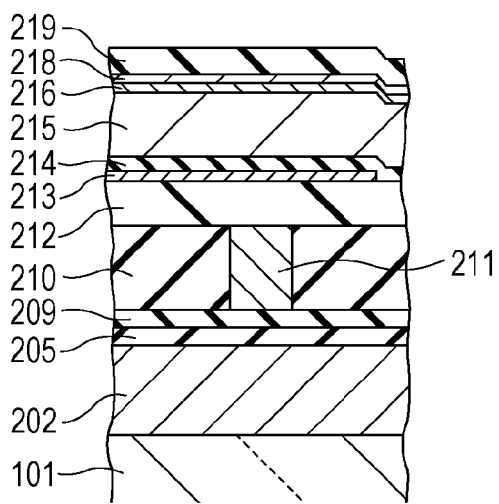

A third embodiment of the present invention is described below with reference to FIGS. 5A to 5C. FIG. 5A is a cross-sectional view taken along line VA-VA of FIG. 2A, FIG. 5B is a cross-sectional view taken along line VB-VB of FIG. 2A, and FIG. 5C is a cross-sectional view taken along line VC-VC of FIG. 2A. The equivalent circuit and the operation principle of the radiation detection apparatus are similar to those according to the first embodiment, and thus a further description thereof is omitted.

The present embodiment is different from the first embodiment in that the signal line 108 and the control electrode of the switch element 105 are both formed by the first conductive layer 202 embedded in the first insulating layer 201. By forming both the signal line 108 and the control electrode of the switch element 105 using the first conductive layer 202, it becomes possible to simplify the production process compared with that according to the first embodiment, which allows an increase in the production yield. Furthermore, in this configuration, the control electrode of the switch element 105 does not cause the third insulating layer 205 serving as the gate insulating film to have a step, and thus it is possible to increase the reliability of the switch element 105.

Also in the present embodiment, as in the second embodiment, it is possible to further reduce the line capacitance by controlling the shapes of the first conductive layer 202 serving as the signal line 108 and the fourth conductive layer 211 serving as the driving line 107. In this regard, the fourth insulating layer 209 may be formed so as to have a large film thickness to increase the distance between the signal line 108 and the driving line 107.

Fourth Embodiment

Figure 6:
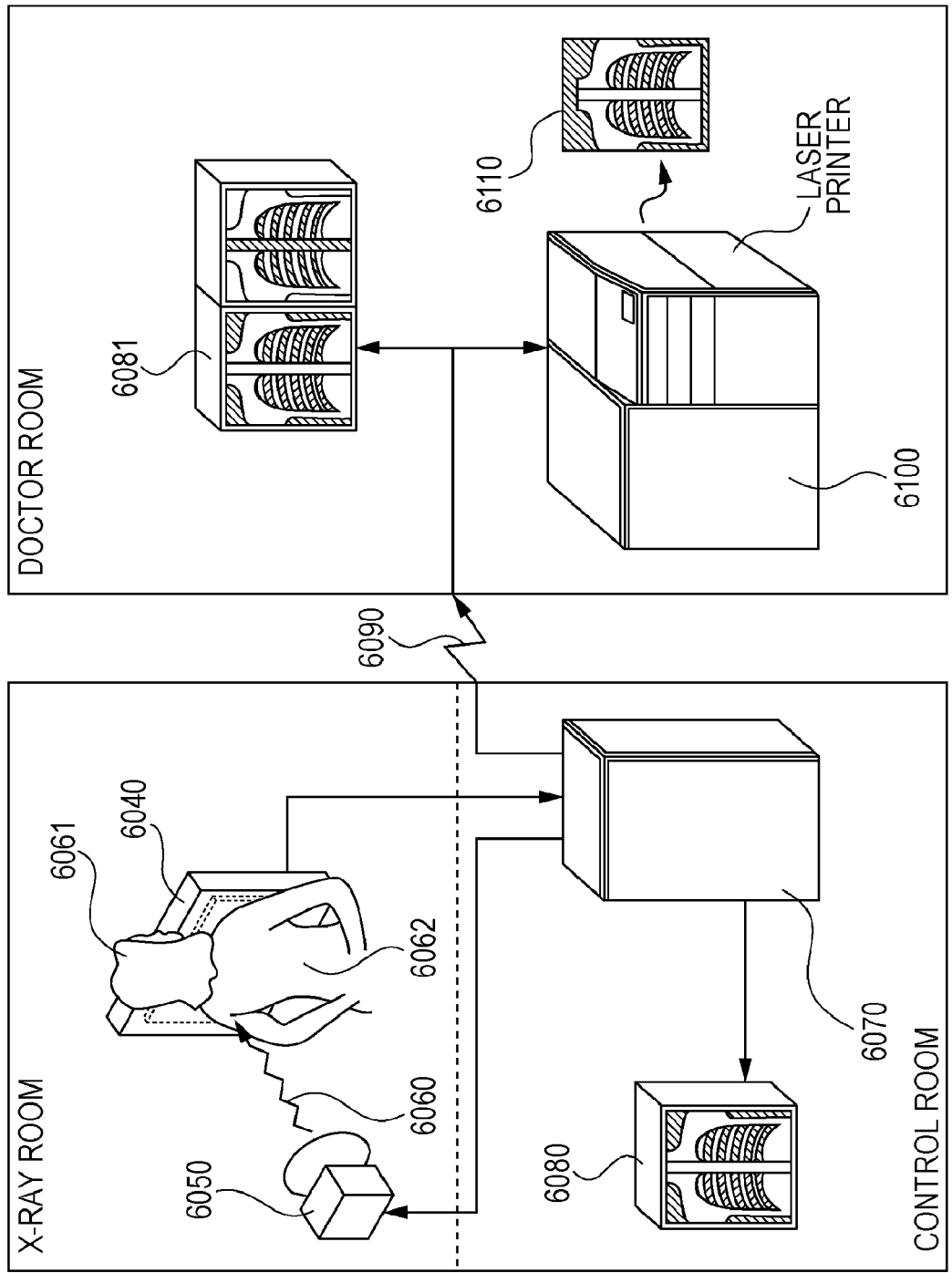
FIG. 6 illustrates an example of a radiation detection system using a radiation detection apparatus according to an embodiment of the present invention.

FIG. 6 illustrates an example of a radiation detection system using a radiation detection apparatus according to an embodiment of the present invention.

In the radiation detection system shown in FIG. 6, X-ray 6060 generated by an X-ray tube 6050 serving as a radiation source passes through a chest 6062 of a patient or a subject 6061 under examination and is incident on a radiation detection apparatus 6040 having a fluorescent member disposed on the top. The X-ray incident on the photoelectric conversion apparatus 6040 includes information on the inside of the body of the patient 6061. In response to the incident X-ray, the fluorescent member emits light. The emitted light is converted into an electric signal. The electric signal is converted into a digital signal and is subjected to image processing by an image processor 6070, such as a computer, serving as a signal processing unit. A resultant image is displayed on a display 6080 serving as a display unit installed in a control room.

The obtained information may be transferred to a remote location via a communications network 6090, such as a telephone line or a wireless link. In this manner, the information may be displayed on a display 6081 serving as a display unit installed in a doctor room at the remote location or it may be stored in a storage medium such as an optical disk. This allows a doctor at the remote location to make a diagnosis. The information may be recorded on a film 6110 serving as a recording medium by a film processor 6100 serving as a recording unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-221797 filed Sep. 30, 2010, which is hereby incorporated by reference herein in its entirety.

What is claimed is:

1. A detection apparatus comprising:
a plurality of pixels arranged in a row direction and column direction, each pixel including a conversion element configured to convert radiation or light into an electric charge and a switch element configured to output an electric signal corresponding to the electric charge, the conversion element being disposed above the switch element;
a driving line connected to a plurality of switch elements arranged in the row direction; and
a signal line connected to a plurality of switch elements arranged in the column direction,
wherein an uppermost surface portion of the driving line is located below each conversion elements,
wherein an uppermost surface portion of each switch element is located below the uppermost surface of the driving line,
and wherein the signal line includes a conductive layer embedded in an insulating member lower than the uppermost surface portion of a main electrode of the switch element.

2. The detection apparatus according to claim 1, wherein the switch element is disposed on an insulating substrate, and
the insulating member is the insulating substrate or an insulating layer disposed between the insulating substrate and the switch element.

3. The detection apparatus according to claim 1, wherein the driving line includes a conductive layer embedded in an insulating layer disposed between the switch element and the conversion element.

4. The detection apparatus according to claim 1, wherein a control electrode of the switch element is formed using the same conductive layer as that used to form the signal line.

5. The detection apparatus according to claim 1, wherein a width of an upper portion of the signal line is smaller than a maximum width of the signal line.

6. The detection apparatus according to claim 1, wherein, when a width of an upper portion, a width of a lower portion, and a maximum width of the driving line are respectively denoted by G1, G2, and G0, the following condition is satisfied:

$G1 < G0$ or $G2 < G0$.

7. The detection apparatus according to claim 1, wherein at least one of the signal line and the driving line is embedded in a plurality of insulating layers.

8. A radiation detection system comprising:
the detection apparatus according to claim 1;
a signal processing unit configured to process a signal supplied from the detection apparatus;
a storage unit configured to store a signal supplied from the signal processing unit;
a display unit configured to display the signal supplied from the signal processing unit;
a transmitting unit configured to transmit the signal supplied from the signal processing unit; and
a radiation source configured to generate the radiation.

* * * * *